US011474575B2

(12) United States Patent
Osterhout et al.

(10) Patent No.: US 11,474,575 B2
(45) Date of Patent: Oct. 18, 2022

(54) THERMAL MANAGEMENT FOR HEAD-WORN COMPUTER

(71) Applicant: Mentor Acquisition One, LLC, Plantation, FL (US)

(72) Inventors: Ralph F. Osterhout, San Francisco, CA (US); Robert Michael Lohse, Palo Alto, CA (US); Michael Van Huynh, San Francisco, CA (US)

(73) Assignee: Mentor Acquisition One, LLC, Plantation, FL (US)

( * ) Notice: Subject to any disclaimer, the term of this patent is extended or adjusted under 35 U.S.C. 154(b) by 35 days.

(21) Appl. No.: 17/184,514

(22) Filed: Feb. 24, 2021

(65) Prior Publication Data

US 2021/0255677 A1    Aug. 19, 2021

Related U.S. Application Data

(63) Continuation of application No. 16/705,148, filed on Dec. 5, 2019, now Pat. No. 10,963,025, which is a continuation of application No. 15/214,591, filed on Jul. 20, 2016, now Pat. No. 10,520,996, which is a
(Continued)

(51) Int. Cl.
| | |
|---|---|
| *G06F 1/16* | (2006.01) |
| *H05K 5/00* | (2006.01) |
| *H05K 7/00* | (2006.01) |
| *G06F 1/20* | (2006.01) |
| *H05K 7/20* | (2006.01) |
| *G02B 27/01* | (2006.01) |
| *H04R 1/10* | (2006.01) |
| *G02C 5/14* | (2006.01) |

(52) U.S. Cl.
CPC .......... *G06F 1/203* (2013.01); *G02B 27/017* (2013.01); *G06F 1/163* (2013.01); *G06F 1/206* (2013.01); *H04R 1/1033* (2013.01); *H05K 7/20409* (2013.01); *G02C 5/143* (2013.01); *H04R 1/1016* (2013.01); *H04R 2420/09* (2013.01)

(58) Field of Classification Search
CPC . G06F 1/163; G06F 1/20; G06F 1/203; G06F 1/206; H05K 7/20409; H05K 7/2039; G02B 27/017; G02B 27/01; G02B 27/0172; G02B 27/0176; G02B 27/0149; G02B 27/0154; G02B 27/0161
See application file for complete search history.

(56) References Cited

U.S. PATENT DOCUMENTS

| | | | |
|---|---|---|---|
| 1,897,833 A | 2/1933 | Benway | |
| 2,064,604 A | 12/1936 | Paul | |
| 3,531,190 A | 9/1970 | Leblanc | |

(Continued)

FOREIGN PATENT DOCUMENTS

| | | | |
|---|---|---|---|
| EP | 368898 A1 | 5/1990 | |
| EP | 777867 A1 | 6/1997 | |

(Continued)

OTHER PUBLICATIONS

US 8,743,465 B2, 06/2014, Totani (withdrawn)
(Continued)

*Primary Examiner* — Anthony M Haughton
(74) *Attorney, Agent, or Firm* — Morrison & Foerster LLP

(57) ABSTRACT

Aspects of the present invention relate to thermal management systems for head-worn computers.

20 Claims, 10 Drawing Sheets

Related U.S. Application Data continuation of application No. 14/490,586, filed on Sep. 18, 2014, now Pat. No. 9,423,842.

(56) References Cited

U.S. PATENT DOCUMENTS

| | | | |
|---|---|---|---|
| 3,671,111 A | 6/1972 | Okner | |
| 4,145,125 A | 3/1979 | Chika | |
| 4,513,812 A | 4/1985 | Papst | |
| 4,695,129 A | 9/1987 | Faessen | |
| D327,674 S | 7/1992 | Kuo | |
| D376,790 S | 12/1996 | Taylor | |
| 5,596,451 A | 1/1997 | Handschy | |
| 5,625,372 A | 4/1997 | Hildebrand | |
| D383,148 S | 9/1997 | Lee | |
| 5,717,422 A | 2/1998 | Fergason | |
| 5,808,800 A | 9/1998 | Handschy | |
| 5,808,802 A | 9/1998 | Hur | |
| 5,954,642 A | 9/1999 | Johnson | |
| 5,971,538 A | 10/1999 | Heffner | |
| 6,034,653 A | 3/2000 | Robertson | |
| 6,076,927 A | 6/2000 | Owens | |
| 6,137,675 A | 10/2000 | Perkins | |
| 6,157,291 A | 12/2000 | Kuenster | |
| 6,195,136 B1 | 2/2001 | Handschy | |
| 6,359,723 B1 | 3/2002 | Handschy | |
| 6,369,952 B1 * | 4/2002 | Rallison | G02B 27/0176 359/630 |
| 6,421,031 B1 | 7/2002 | Ronzani | |
| 6,456,438 B1 | 9/2002 | Lee | |
| 6,480,174 B1 | 11/2002 | Kaufmann | |
| 6,491,389 B2 | 12/2002 | Yaguchi | |
| D470,144 S | 2/2003 | Li | |
| 6,535,182 B2 | 3/2003 | Stanton | |
| D473,871 S | 4/2003 | Santos | |
| 6,824,265 B1 | 11/2004 | Harper | |
| 6,847,336 B1 | 1/2005 | Lemelson | |
| 6,987,787 B1 | 1/2006 | Mick | |
| D521,493 S | 5/2006 | Wai | |
| 7,088,234 B2 | 8/2006 | Naito | |
| 7,199,934 B2 | 4/2007 | Yamasaki | |
| 7,206,134 B2 | 4/2007 | Weissman | |
| 7,425,065 B2 | 9/2008 | Wang | |
| 7,582,828 B2 | 9/2009 | Ryan | |
| 7,791,889 B2 | 9/2010 | Belady | |
| 7,830,370 B2 | 11/2010 | Yamazaki | |
| D628,616 S | 12/2010 | Yuan | |
| 7,850,301 B2 | 12/2010 | Dichiara | |
| 7,855,743 B2 | 12/2010 | Sako | |
| 7,928,926 B2 | 4/2011 | Yamamoto | |
| 8,004,765 B2 | 8/2011 | Amitai | |
| D645,492 S | 9/2011 | Zhao | |
| D645,493 S | 9/2011 | Zhao | |
| D646,316 S | 10/2011 | Zhao | |
| D647,947 S | 11/2011 | Yu | |
| 8,089,568 B1 | 1/2012 | Brown | |
| 8,092,007 B2 | 1/2012 | Dichiara | |
| 8,228,315 B1 | 7/2012 | Starner | |
| D665,838 S | 8/2012 | Kim | |
| D667,482 S | 9/2012 | Healy | |
| D667,483 S | 9/2012 | Krsmanovic | |
| D669,066 S | 10/2012 | Olsson | |
| D671,590 S | 11/2012 | Klinar | |
| 8,378,924 B2 | 2/2013 | Jacobsen | |
| D680,152 S | 4/2013 | Olsson | |
| 8,427,396 B1 | 4/2013 | Kim | |
| D685,019 S | 6/2013 | Li | |
| 8,494,215 B2 | 7/2013 | Kimchi | |
| D692,047 S | 10/2013 | Shin | |
| 8,553,910 B1 | 10/2013 | Dong | |
| 8,564,883 B2 | 10/2013 | Totani | |
| 8,570,273 B1 | 10/2013 | Smith | |
| D693,398 S | 11/2013 | Rubin | |
| 8,576,276 B2 | 11/2013 | Bar-zeev | |
| 8,576,491 B2 | 11/2013 | Takagi | |
| 8,587,869 B2 | 11/2013 | Totani | |
| 8,593,795 B1 | 11/2013 | Chi | |
| 8,594,467 B2 | 11/2013 | Lu | |
| 8,662,686 B2 | 3/2014 | Takagi | |
| 8,665,214 B2 | 3/2014 | Forutanpour | |
| 8,670,183 B2 | 3/2014 | Clavin | |
| 8,678,581 B2 | 3/2014 | Blum | |
| 8,696,113 B2 | 4/2014 | Lewis | |
| 8,698,157 B2 | 4/2014 | Hanamura | |
| 8,711,487 B2 | 4/2014 | Takeda | |
| D704,764 S | 5/2014 | Markovitz | |
| 8,733,927 B1 | 5/2014 | Lewis | |
| 8,733,928 B1 | 5/2014 | Lewis | |
| 8,743,052 B1 | 6/2014 | Keller | |
| 8,745,058 B1 | 6/2014 | Garcia-barrio | |
| 8,750,541 B1 | 6/2014 | Dong | |
| 8,752,963 B2 | 6/2014 | Mcculloch | |
| 8,787,006 B2 | 7/2014 | Golko | |
| 8,803,867 B2 | 8/2014 | Oikawa | |
| 8,814,691 B2 | 8/2014 | Haddick | |
| 8,823,071 B2 | 9/2014 | Oyamada | |
| 8,837,880 B2 | 9/2014 | Takeda | |
| 8,866,702 B1 | 10/2014 | Wong | |
| D716,808 S | 11/2014 | Yeom | |
| 8,878,749 B1 | 11/2014 | Wu | |
| D719,568 S | 12/2014 | Heinrich | |
| D719,569 S | 12/2014 | Heinrich | |
| D719,570 S | 12/2014 | Heinrich | |
| 8,922,530 B2 | 12/2014 | Pance | |
| D723,092 S | 2/2015 | Markovitz | |
| D723,093 S | 2/2015 | Li | |
| 8,955,973 B2 | 2/2015 | Raffle | |
| 8,957,835 B2 | 2/2015 | Hoellwarth | |
| 8,964,298 B2 | 2/2015 | Haddick | |
| D724,083 S | 3/2015 | Olsson | |
| 8,971,023 B2 | 3/2015 | Olsson | |
| D727,317 S | 4/2015 | Olsson | |
| 9,031,273 B2 | 5/2015 | Dong | |
| D730,975 S | 6/2015 | Stables | |
| D732,025 S | 6/2015 | Heinrich | |
| D733,709 S | 7/2015 | Kawai | |
| 9,105,261 B2 | 8/2015 | Horii | |
| D738,373 S | 9/2015 | Davies | |
| 9,128,281 B2 | 9/2015 | Osterhout | |
| 9,129,295 B2 | 9/2015 | Border | |
| 9,143,693 B1 | 9/2015 | Zhou | |
| D741,398 S | 10/2015 | Echeverri | |
| 9,158,116 B1 | 10/2015 | Osterhout | |
| D744,581 S | 12/2015 | Votel | |
| D745,007 S | 12/2015 | Cazalet | |
| D751,551 S | 3/2016 | Ho | |
| D751,552 S | 3/2016 | Osterhout | |
| D757,006 S | 5/2016 | Cazalet | |
| D761,796 S | 7/2016 | Heinrich | |
| D765,076 S | 8/2016 | Rochat | |
| 9,423,842 B2 | 8/2016 | Osterhout | |
| D768,759 S | 10/2016 | Markovitz | |
| D769,873 S | 10/2016 | Cazalet | |
| 9,482,880 B1 | 11/2016 | Chandrasekhar | |
| 9,523,856 B2 | 12/2016 | Osterhout | |
| 9,529,195 B2 | 12/2016 | Osterhout | |
| 9,529,199 B2 | 12/2016 | Osterhout | |
| 9,651,787 B2 | 5/2017 | Haddick | |
| 9,651,788 B2 | 5/2017 | Osterhout | |
| 9,651,789 B2 | 5/2017 | Osterhout | |
| 9,658,473 B2 | 5/2017 | Lewis | |
| 9,672,210 B2 | 6/2017 | Osterhout | |
| 9,684,172 B2 | 6/2017 | Border | |
| D792,400 S | 7/2017 | Osterhout | |
| D793,391 S | 8/2017 | Nakagawa | |
| D793,467 S | 8/2017 | Krause | |
| D794,022 S | 8/2017 | Limaye | |
| D795,865 S | 8/2017 | Porter | |
| 9,746,676 B2 | 8/2017 | Osterhout | |
| D796,504 S | 9/2017 | Natsume | |
| D796,506 S | 9/2017 | Natsume | |
| D800,118 S | 10/2017 | Xing | |
| D803,832 S | 11/2017 | Lin | |
| 9,846,308 B2 | 12/2017 | Osterhout | |
| 9,897,822 B2 | 2/2018 | Osterhout | |

(56) References Cited

U.S. PATENT DOCUMENTS

| | | | |
|---|---|---|---|
| 10,039,445 B1* | 8/2018 | Torch | G06F 3/011 |
| 10,185,147 B2 | 1/2019 | Lewis | |
| 10,251,292 B2* | 4/2019 | Araki | H05K 5/0086 |
| 10,520,996 B2 | 12/2019 | Osterhout | |
| 10,963,025 B2 | 3/2021 | Osterhout et al. | |
| 2002/0021498 A1 | 2/2002 | Ohtaka | |
| 2002/0054272 A1 | 5/2002 | Ebata | |
| 2003/0030912 A1 | 2/2003 | Gleckman | |
| 2004/0008158 A1 | 1/2004 | Chi | |
| 2004/0066363 A1 | 4/2004 | Yamano | |
| 2004/0132509 A1 | 7/2004 | Glezerman | |
| 2005/0264752 A1 | 12/2005 | Howell | |
| 2006/0061542 A1 | 3/2006 | Stokic | |
| 2006/0239629 A1 | 10/2006 | Qi | |
| 2007/0296684 A1 | 12/2007 | Thomas | |
| 2008/0122736 A1 | 5/2008 | Ronzani | |
| 2008/0125288 A1 | 5/2008 | Case | |
| 2008/0143954 A1 | 6/2008 | Abreu | |
| 2008/0291277 A1 | 11/2008 | Jacobsen | |
| 2009/0013204 A1 | 1/2009 | Kobayashi | |
| 2009/0040296 A1 | 2/2009 | Moscato | |
| 2009/0108837 A1 | 4/2009 | Johansson | |
| 2009/0279180 A1 | 11/2009 | Amitai | |
| 2010/0045928 A1 | 2/2010 | Levy | |
| 2010/0079356 A1 | 4/2010 | Hoellwarth | |
| 2010/0079508 A1 | 4/2010 | Hodge | |
| 2010/0149073 A1 | 6/2010 | Chaum | |
| 2010/0309426 A1 | 12/2010 | Howell | |
| 2011/0159931 A1 | 6/2011 | Boss | |
| 2011/0213664 A1 | 9/2011 | Osterhout | |
| 2011/0221672 A1 | 9/2011 | Osterhout | |
| 2011/0234475 A1 | 9/2011 | Endo | |
| 2011/0241975 A1 | 10/2011 | Mukawa | |
| 2011/0285764 A1 | 11/2011 | Kimura | |
| 2012/0026455 A1 | 2/2012 | Takahashi | |
| 2012/0050493 A1 | 3/2012 | Ernst | |
| 2012/0062850 A1 | 3/2012 | Travis | |
| 2012/0075168 A1 | 3/2012 | Osterhout | |
| 2012/0113514 A1 | 5/2012 | Rodman | |
| 2012/0162270 A1 | 6/2012 | Fleck | |
| 2012/0169608 A1 | 7/2012 | Forutanpour | |
| 2012/0212593 A1 | 8/2012 | Na | |
| 2012/0223885 A1 | 9/2012 | Perez | |
| 2012/0242570 A1 | 9/2012 | Kobayashi | |
| 2012/0242698 A1 | 9/2012 | Haddick | |
| 2012/0250152 A1 | 10/2012 | Larson | |
| 2012/0264510 A1 | 10/2012 | Wigdor | |
| 2012/0268449 A1 | 10/2012 | Choi | |
| 2012/0306850 A1 | 12/2012 | Balan | |
| 2012/0307198 A1 | 12/2012 | Ifergan | |
| 2012/0326948 A1 | 12/2012 | Crocco | |
| 2012/0327116 A1 | 12/2012 | Liu | |
| 2013/0009366 A1 | 1/2013 | Hannegan | |
| 2013/0044042 A1 | 2/2013 | Olsson | |
| 2013/0063695 A1 | 3/2013 | Hsieh | |
| 2013/0069985 A1 | 3/2013 | Wong | |
| 2013/0083009 A1 | 4/2013 | Geisner | |
| 2013/0100259 A1 | 4/2013 | Ramaswamy | |
| 2013/0127980 A1* | 5/2013 | Haddick | G06F 3/013 348/14.08 |
| 2013/0154913 A1 | 6/2013 | Genc | |
| 2013/0196757 A1 | 8/2013 | Latta | |
| 2013/0201080 A1 | 8/2013 | Evans | |
| 2013/0201081 A1 | 8/2013 | Evans | |
| 2013/0235331 A1 | 9/2013 | Heinrich | |
| 2013/0250503 A1* | 9/2013 | Olsson | G02C 5/12 361/679.03 |
| 2013/0257622 A1 | 10/2013 | Davalos | |
| 2013/0265212 A1 | 10/2013 | Kato | |
| 2013/0293580 A1 | 11/2013 | Spivack | |
| 2013/0342981 A1* | 12/2013 | Cox | G06F 3/042 361/679.01 |
| 2014/0028704 A1 | 1/2014 | Wu | |
| 2014/0029498 A1 | 1/2014 | Kim | |
| 2014/0043682 A1 | 2/2014 | Hussey | |
| 2014/0062854 A1 | 3/2014 | Cho | |
| 2014/0063473 A1 | 3/2014 | Pasolini | |
| 2014/0111864 A1 | 4/2014 | Margulis | |
| 2014/0129328 A1 | 5/2014 | Mathew | |
| 2014/0146394 A1 | 5/2014 | Tout | |
| 2014/0147829 A1 | 5/2014 | Jerauld | |
| 2014/0152530 A1 | 6/2014 | Venkatesha | |
| 2014/0152558 A1 | 6/2014 | Salter | |
| 2014/0152676 A1 | 6/2014 | Rohn | |
| 2014/0153173 A1* | 6/2014 | Pombo | G02B 27/0176 29/592.1 |
| 2014/0159995 A1 | 6/2014 | Adams | |
| 2014/0160055 A1 | 6/2014 | Margolis | |
| 2014/0160157 A1 | 6/2014 | Poulos | |
| 2014/0160170 A1 | 6/2014 | Lyons | |
| 2014/0168735 A1 | 6/2014 | Yuan | |
| 2014/0176603 A1 | 6/2014 | Kumar | |
| 2014/0177023 A1 | 6/2014 | Gao | |
| 2014/0183269 A1 | 7/2014 | Glaser | |
| 2014/0206416 A1 | 7/2014 | Aurongzeb | |
| 2014/0347572 A1 | 11/2014 | Liu | |
| 2014/0375545 A1 | 12/2014 | Ackerman | |
| 2015/0029088 A1 | 1/2015 | Kim | |
| 2015/0042544 A1 | 2/2015 | Sugihara | |
| 2015/0084862 A1 | 3/2015 | Sugihara | |
| 2015/0145839 A1 | 5/2015 | Hack | |
| 2015/0168730 A1 | 6/2015 | Ashkenazi | |
| 2015/0178932 A1 | 6/2015 | Wyatt | |
| 2015/0198807 A1 | 7/2015 | Hirai | |
| 2015/0205117 A1 | 7/2015 | Border | |
| 2015/0205132 A1 | 7/2015 | Osterhout | |
| 2015/0293587 A1 | 10/2015 | Wilairat | |
| 2015/0294627 A1 | 10/2015 | Yoo | |
| 2015/0309317 A1 | 10/2015 | Osterhout | |
| 2015/0309534 A1 | 10/2015 | Osterhout | |
| 2015/0309995 A1 | 10/2015 | Osterhout | |
| 2015/0346496 A1 | 12/2015 | Haddick | |
| 2015/0346511 A1 | 12/2015 | Osterhout | |
| 2015/0347823 A1 | 12/2015 | Monnerat | |
| 2015/0382305 A1 | 12/2015 | Drincic | |
| 2016/0018646 A1 | 1/2016 | Osterhout | |
| 2016/0018647 A1 | 1/2016 | Osterhout | |
| 2016/0018648 A1 | 1/2016 | Osterhout | |
| 2016/0018649 A1 | 1/2016 | Osterhout | |
| 2016/0048025 A1 | 2/2016 | Cazalet | |
| 2016/0049108 A1* | 2/2016 | Yajima | A63F 13/5255 345/212 |
| 2016/0085278 A1 | 3/2016 | Osterhout | |
| 2016/0131904 A1 | 5/2016 | Border | |
| 2016/0131911 A1 | 5/2016 | Border | |
| 2016/0132082 A1 | 5/2016 | Border | |
| 2016/0133201 A1 | 5/2016 | Border | |
| 2016/0161743 A1 | 6/2016 | Osterhout | |
| 2016/0161747 A1 | 6/2016 | Osterhout | |
| 2016/0171846 A1 | 6/2016 | Brav | |
| 2016/0178904 A1 | 6/2016 | Deleeuw | |
| 2016/0187658 A1 | 6/2016 | Osterhout | |
| 2016/0209674 A1 | 7/2016 | Montalban | |
| 2016/0246055 A1 | 8/2016 | Border | |
| 2016/0370606 A1 | 12/2016 | Huynh | |
| 2017/0219831 A1 | 8/2017 | Haddick | |
| 2017/0220865 A1 | 8/2017 | Osterhout | |
| 2017/0227778 A1 | 8/2017 | Osterhout | |
| 2017/0227793 A1 | 8/2017 | Abreu | |
| 2017/0235133 A1 | 8/2017 | Border | |
| 2017/0235134 A1 | 8/2017 | Border | |
| 2017/0337187 A1 | 11/2017 | Osterhout | |
| 2017/0337737 A1* | 11/2017 | Edwards | F16M 13/04 |
| 2017/0351098 A1 | 12/2017 | Osterhout | |
| 2018/0003984 A1* | 1/2018 | Lai | A42B 7/00 |
| 2018/0003988 A1 | 1/2018 | Osterhout | |
| 2018/0059434 A1 | 3/2018 | Heisey | |
| 2018/0295733 A1* | 10/2018 | Wen | H05K 5/0217 |

FOREIGN PATENT DOCUMENTS

| | | |
|---|---|---|
| EP | 2486450 A1 | 8/2012 |
| EP | 2502410 A1 | 9/2012 |
| JP | 2009171505 A | 7/2009 |

(56) References Cited

FOREIGN PATENT DOCUMENTS

| JP | 5017989 | B2 | 9/2012 |
|---|---|---|---|
| JP | 2012212990 | A | 11/2012 |
| KR | 1020110101944 | | 9/2011 |
| WO | 2011143655 | A1 | 11/2011 |
| WO | 2012058175 | A1 | 5/2012 |
| WO | 2013050650 | A1 | 4/2013 |
| WO | 2013103825 | A1 | 7/2013 |
| WO | 2013110846 | A1 | 8/2013 |
| WO | 2013170073 | A1 | 11/2013 |
| WO | 2013176079 | A1 | 11/2013 |
| WO | 2016073734 | A1 | 5/2016 |
| WO | 2016205601 | A1 | 12/2016 |
| WO | 2017100074 | A1 | 6/2017 |
| WO | 2018044537 | A1 | 3/2018 |

OTHER PUBLICATIONS

US 8,792,178 B2, 07/2014, Totani (withdrawn)
PCT/US2015/059264, , "International Application Serial No. PCT/US2015/059264, International Search Report and Written Opinion dated Feb. 19, 2016", Osterhout Group, Inc., 11 Pages.
Clements-Cortes, et al. "Short-Term Effects of Rhythmic Sensory Stimulation in Alzheimer's Disease: An Exploratory Pilot Study," Journal of Alzheimer's Disease 52 (2016), IOS Press Feb. 9, 2016, pp. 651-660.
Final Office Action dated Feb. 9, 2018, for U.S. Appl. No. 15/214,591, filed Jul. 20, 2016, eight pages.
Logbar Inc., "Ring: Shortcut Everything", https://www.kickstarter.com/projects/1761670738/ring-shortcut-everything, Dec. 2014, 22 pages.
Non-Final Office Action dated Aug. 7, 2020, for U.S. Appl. No. 16/705,148, filed Dec. 5, 2019, five pages.
Non-Final Office Action dated Feb. 15, 2019, for U.S. Appl. No. 15/214,591, filed Jul. 20, 2016, 12 pages.
Non-Final Office Action dated Jun. 30, 2017, for U.S. Appl. No. 15/214,591, filed Jul. 20, 2016, seven pages.
Notice of Allowance dated Aug. 6, 2019, for U.S. Appl. No. 15/214,591, filed Jul. 20, 2016, eight pages.
Notice of Allowance dated Nov. 25, 2020, for U.S. Appl. No. 16/705,148, filed Dec. 5, 2019, 8 pages.
Osterhout. (Oct. 14, 2015). "Commercial and Social Implications", 12 pages.
PCT Patent Application No. PCT/US2017/046701, filed Aug. 14, 2017.
PCT/2016/064441, Application Serial No. PCT/US2016/064441, International Search Report and Written Opinion dated Feb. 7, 2017, Osterhout Group, Inc., 16 pages.
PCT/US2015/059264, International Application Serial No. PCT/US2015/059264, International Preliminary report on Patentability and Written Opinion dated May 18, 2017, Osterhout Group, Inc., eight pages.
PCT/US2016/038008, International Application Serial No. PCT/US2016/038008, International Preliminary Report on Patentability dated Dec. 28, 2017, Osterhout Group, Inc, six pages.
PCT/US2016/038008, International Application Serial No. PCT/US2016/038008, International Search Report and Written Opinion dated Oct. 27, 2016, Osterhout Group, Inc. eight pages.
PCTUS2017046701, "Application Serial No. PCTUS2017046701, International Search Report and the Written Opinion dated Nov. 6, 2017", 7 pages.
Schedwill, "Bidirectional OLED Microdisplay", Fraunhofer Research Institution for Organics, Materials and Electronic Device COMEDD, Apr. 11, 2014, 2 pages.
U.S. Appl. No. 15/170,256, filed Jun. 1, 2016.
U.S. Appl. No. 15/249,637, filed Aug. 29, 2016.
U.S. Appl. No. 15/494,827, filed Apr. 24, 2017.
U.S. Appl. No. 15/683,383, filed Aug. 22, 2017.
Vogel, et al., "Data glasses controlled by eye movements", Information and communication, Fraunhofer-Gesellschaft, Sep. 22, 2013, 2 pages.
Ye, Hui et al., "High Quality Voice Morphing", Cambridge University Engineering Department Trumpington Street, Cambridge, England, CB2 1PZ, 2004, I-9-I-12.
"Audio Spotlight," by Holosonics, http://www.holosonics.com, accessed Jul. 3, 2014, three pages.
"Genius Ring Mice," http://www.geniusnet.com/Genius/wSite/productCompare/compare.jsp, Dec. 23, 2014, one page.
"Sound from Ultrasound," Wikipedia entry, http://en.m.wikipedia.org/wiki/Sound_from_ultrasound, accessed Jul. 3, 2014, 13 pages.

* cited by examiner

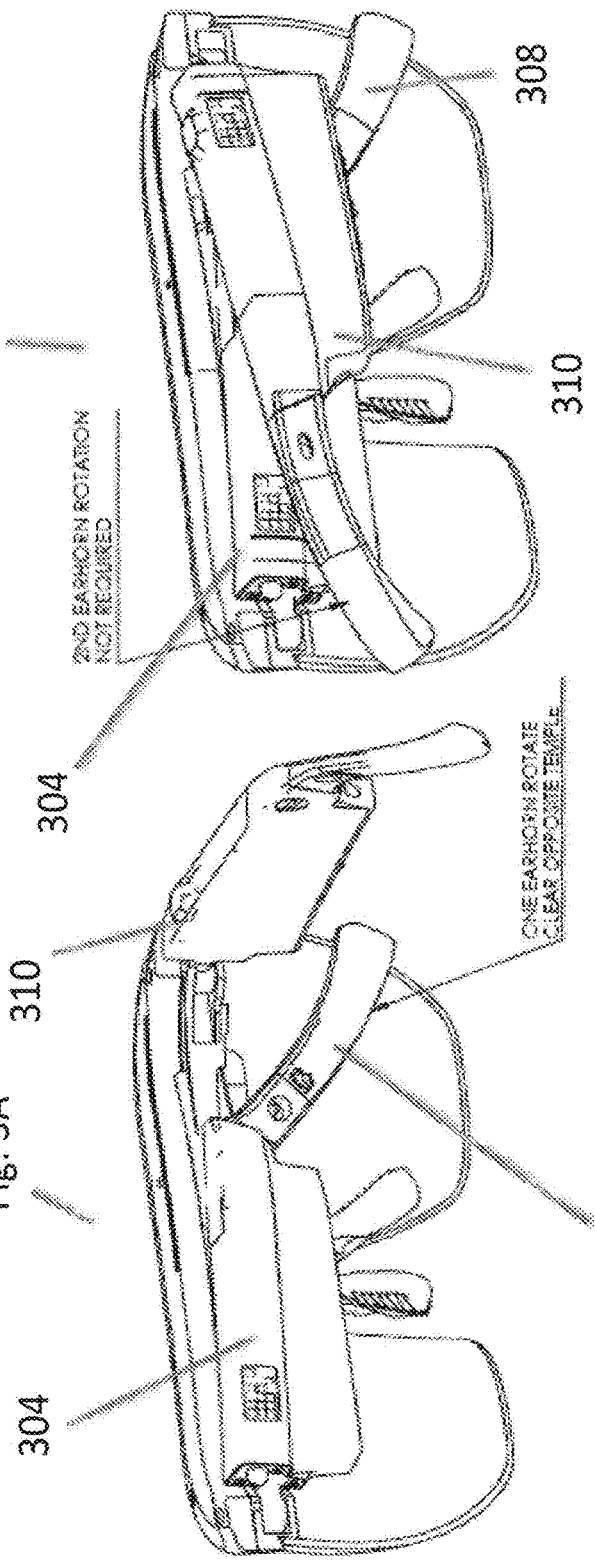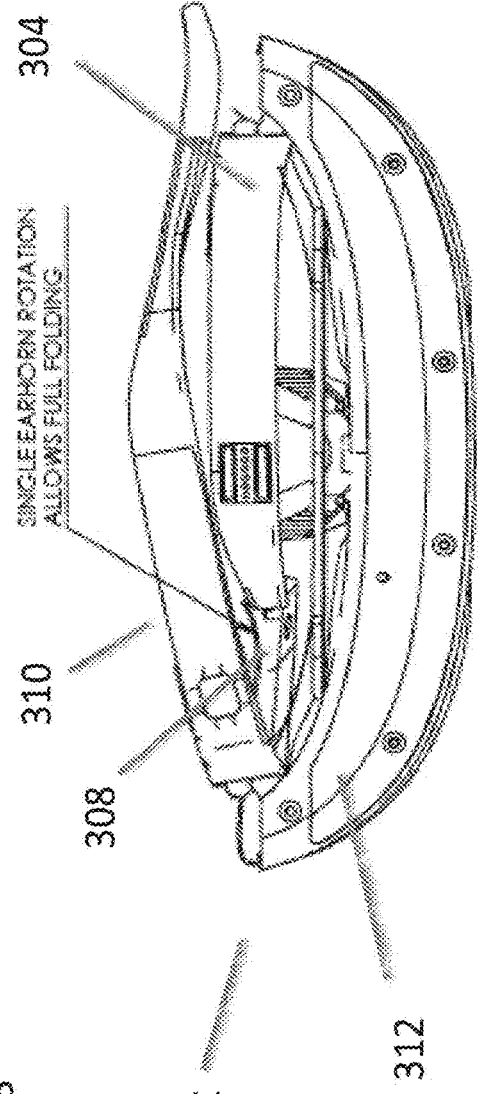

THERMAL MANAGEMENT FOR HEAD-WORN COMPUTER

CROSS REFERENCE OF RELATED APPLICATIONS

This application claims the benefit of priority to and is a continuation of the following U.S. patent applications, which are incorporated by reference herein in their entirety: U.S. non-provisional application Ser. No. 16/705,148 (now U.S. Publication no. 2020/0249733), filed Dec. 5, 2019, which is a continuation of U.S. non-provisional application Ser. No. 15/214,591 (now U.S. Pat. No. 10,520,996 issued on Dec. 31, 2019), filed Jul. 20, 2016, which is a continuation of U.S. non-provisional application Ser. No. 14/490,586 (now U.S. Pat. No. 9,423,842 issued on Aug. 23, 2016), filed Sep. 18, 2014.

BACKGROUND

Field of the Invention

This invention relates to head worn computing. More particularly, this invention relates to thermal management systems for head-worn computers.

Description of Related Art

Wearable computing systems have been developed and are beginning to be commercialized. Many problems persist in the wearable computing field that need to be resolved to make them meet the demands of the market.

SUMMARY

Aspects of the present invention relate to thermal management systems for head-worn computers.

These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE DRAWINGS

Embodiments are described with reference to the following Figures. The same numbers may be used throughout to reference like features and components that are shown in the Figures:

FIG. 3A, FIG. 3B, and FIG. 3C illustrate three views of a head worn computer in accordance with the principles of the present invention.

FIG. 9 illustrates a stiff ear horn with a touch pad for a head-worn computer in accordance with the principles of the present invention.

While the invention has been described in connection with certain preferred embodiments, other embodiments would be understood by one of ordinary skill in the art and are encompassed herein.

DETAILED DESCRIPTION OF THE PREFERRED EMBODIMENT(S)

Aspects of the present invention relate to head-worn computing ("HWC") systems. HWC involves, in some instances, a system that mimics the appearance of head-worn glasses or sunglasses. The glasses may be a fully developed computing platform, such as including computer displays presented in each of the lenses of the glasses to the eyes of the user. In embodiments, the lenses and displays may be configured to allow a person wearing the glasses to see the environment through the lenses while also seeing, simultaneously, digital imagery, which forms an overlaid image that is perceived by the person as a digitally augmented image of the environment, or augmented reality ("AR").

HWC involves more than just placing a computing system on a person's head. The system may need to be designed as a lightweight, compact and fully functional computer display, such as wherein the computer display includes a high resolution digital display that provides a high level of emersion comprised of the displayed digital content and the see-through view of the environmental surroundings. User interfaces and control systems suited to the HWC device may be required that are unlike those used for a more conventional computer such as a laptop. For the HWC and associated systems to be most effective, the glasses may be equipped with sensors to determine environmental conditions, geographic location, relative positioning to other points of interest, objects identified by imaging and movement by the user or other users in a connected group, and the like. The HWC may then change the mode of operation to match the conditions, location, positioning, movements, and the like, in a method generally referred to as a contextually aware HWC. The glasses also may need to be connected, wirelessly or otherwise, to other systems either locally or through a network. Controlling the glasses may be achieved through the use of an external device, automatically through contextually gathered information, through user gestures captured by the glasses sensors, and the like. Each technique may be further refined depending on the software application being used in the glasses. The glasses may further be used to control or coordinate with external devices that are associated with the glasses.

Figure 1:
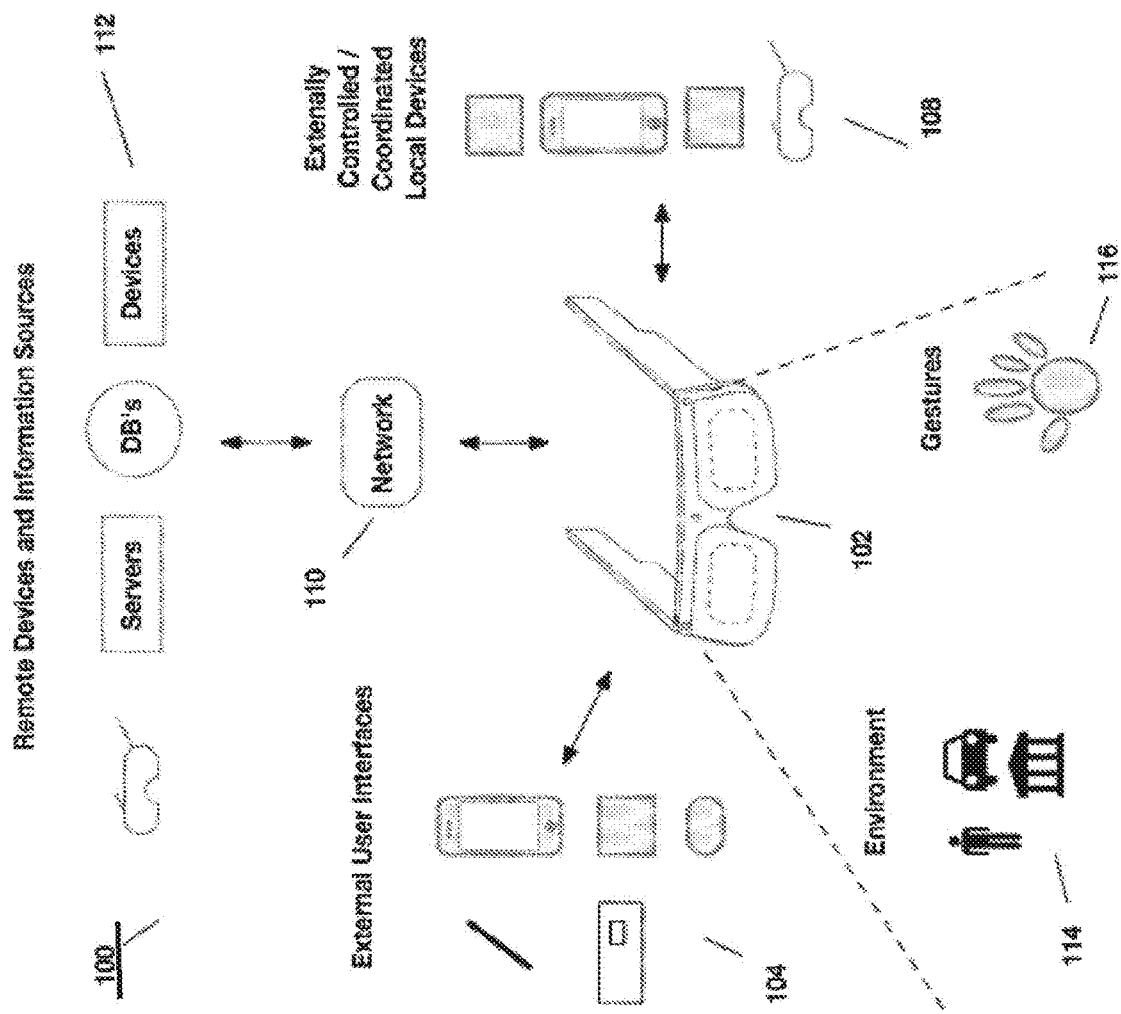
FIG. 1 illustrates a head worn computing system in accordance with the principles of the present invention.

Referring to FIG. 1, an overview of the HWC system 100 is presented. As shown, the HWC system 100 comprises a HWC 102, which in this instance is configured as glasses to be worn on the head with sensors such that the HWC 102 is aware of the objects and conditions in the environment 114. In this instance, the HWC 102 also receives and interprets control inputs such as gestures and movements 116 of body parts of a user. The HWC 102 may communicate with external user interfaces 104. The external user interfaces 104 may provide a physical user interface to take control instructions from a user of the HWC 102 and the external user interfaces 104 and the HWC 102 may communicate bi-directionally to affect the user's command and provide feedback to the external device 108. The HWC 102 may also communicate bi-directionally with externally controlled or coordinated local devices 108. For example, an external user interface 104 may be used in connection with the HWC 102 to control an externally controlled or coordinated local device 108. The externally controlled or coordinated local device 108 may provide feedback to the HWC 102 and a customized GUI may be presented in the HWC 102 based on the type of device or specifically identified device 108. The HWC 102 may also interact with remote devices and information sources 112 through a network connection 110. Again, the external user interface 104 may be used in connection with the HWC 102 to control or otherwise interact with any of the remote devices 108 and information sources 112 in a similar way as when the external user interfaces 104 are used to control or otherwise interact with the externally controlled or coordinated local devices 108. Similarly, HWC 102 may interpret gestures 116 (e.g captured from forward, downward, upward, rearward facing sensors such as camera(s), range finders, IR sensors, etc.) or environmental conditions sensed in the environment 114 to control either local or remote devices 108 or 112.

We will now describe each of the main elements depicted on FIG. 1 in more detail; however, these descriptions are intended to provide general guidance and should not be construed as limiting. Additional description of each element may also be further described herein.

The HWC 102 is a computing platform intended to be worn on a person's head. The HWC 102 may take many different forms to fit many different functional requirements. In some situations, the HWC 102 will be designed in the form of conventional glasses. The glasses may or may not have active computer graphics displays. In situations where the HWC 102 has integrated computer displays the displays may be configured as see-through displays such that the digital imagery can be overlaid with respect to the user's view of the environment 114. There are a number of see-through optical designs that may be used, including ones that have a reflective display (e.g. LCoS, DLP), emissive displays (e.g. OLED, LED), hologram, TIR waveguides, and the like. In embodiments, lighting systems used in connection with the display optics may be solid state lighting systems, such as LED, OLED, quantum dot, quantum dot LED, etc. In addition, the optical configuration may be monocular or binocular. It may also include vision corrective optical components. In embodiments, the optics may be packaged as contact lenses. In other embodiments, the HWC 102 may be in the form of a helmet with a see-through shield, sunglasses, safety glasses, goggles, a mask, fire helmet with see-through shield, police helmet with see through shield, military helmet with see-through shield, utility form customized to a certain work task (e.g. inventory control, logistics, repair, maintenance, etc.), and the like.

The HWC 102 may also have a number of integrated computing facilities, such as an integrated processor, integrated power management, communication structures (e.g. cell net, WiFi, Bluetooth, local area connections, mesh connections, remote connections (e.g. client server, etc.)), and the like. The HWC 102 may also have a number of positional awareness sensors, such as GPS, electronic compass, altimeter, tilt sensor, IMU, and the like. It may also have other sensors such as a camera, rangefinder, hyperspectral camera, Geiger counter, microphone, spectral illumination detector, temperature sensor, chemical sensor, biologic sensor, moisture sensor, ultrasonic sensor, and the like.

The HWC 102 may also have integrated control technologies. The integrated control technologies may be contextual based control, passive control, active control, user control, and the like. For example, the HWC 102 may have an integrated sensor (e.g. camera) that captures user hand or body gestures 116 such that the integrated processing system can interpret the gestures and generate control commands for the HWC 102. In another example, the HWC 102 may have sensors that detect movement (e.g. a nod, head shake, and the like) including accelerometers, gyros and other inertial measurements, where the integrated processor may interpret the movement and generate a control command in response. The HWC 102 may also automatically control itself based on measured or perceived environmental conditions. For example, if it is bright in the environment the HWC 102 may increase the brightness or contrast of the displayed image. In embodiments, the integrated control technologies may be mounted on the HWC 102 such that a user can interact with it directly. For example, the HWC 102 may have a button(s), touch capacitive interface, and the like.

As described herein, the HWC 102 may be in communication with external user interfaces 104. The external user interfaces may come in many different forms. For example, a cell phone screen may be adapted to take user input for control of an aspect of the HWC 102. The external user interface may be a dedicated UI, such as a keyboard, touch surface, button(s), joy stick, and the like. In embodiments, the external controller may be integrated into another device such as a ring, watch, bike, car, and the like. In each case, the external user interface 104 may include sensors (e.g. IMU, accelerometers, compass, altimeter, and the like) to provide additional input for controlling the HWD 104.

As described herein, the HWC 102 may control or coordinate with other local devices 108. The external devices 108 may be an audio device, visual device, vehicle, cell phone, computer, and the like. For instance, the local external device 108 may be another HWC 102, where information may then be exchanged between the separate HWCs 108.

Similar to the way the HWC 102 may control or coordinate with local devices 106, the HWC 102 may control or coordinate with remote devices 112, such as the HWC 102 communicating with the remote devices 112 through a network 110. Again, the form of the remote device 112 may have many forms. Included in these forms is another HWC 102. For example, each HWC 102 may communicate its GPS position such that all the HWCs 102 know where all of HWC 102 are located.

Figure 2:
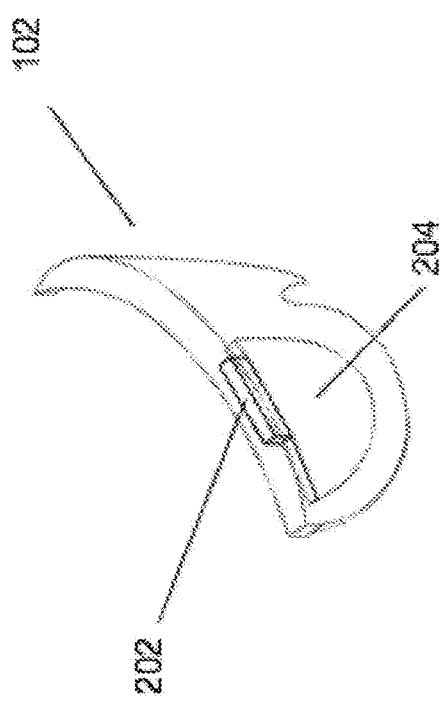
FIG. 2 illustrates a head worn computing system with optical system in accordance with the principles of the present invention.

FIG. 2 illustrates a HWC 102 with an optical system that includes an upper optical module 202 and a lower optical module 204. While the upper and lower optical modules 202 and 204 will generally be described as separate modules, it should be understood that this is illustrative only and the present invention includes other physical configurations, such as that when the two modules are combined into a single module or where the elements making up the two modules are configured into more than two modules. In embodiments, the upper module 202 includes a computer controlled display (e.g. LCoS, DLP, OLED, etc.) and image light delivery optics. In embodiments, the lower module includes eye delivery optics that are configured to receive the upper module's image light and deliver the image light to the eye of a wearer of the HWC. In FIG. 2, it should be noted that while the upper and lower optical modules 202 and 204 are illustrated in one side of the HWC such that image light can be delivered to one eye of the wearer, that it is envisioned by the present invention that embodiments will contain two image light delivery systems, one for each eye. It should also be noted that while many embodiments refer to the optical modules as "upper" and "lower" it should be understood that this convention is being used to make it easier for the reader and that the modules are not necessarily located in an upper-lower relationship. For example, the image generation module may be located above the eye delivery optics, below the eye delivery optics, on a side of the eye delivery optics, or otherwise positioned to satisfy the needs of the situation and/or the HWC 102 mechanical and optical requirements.

An aspect of the present invention relates to the mechanical and electrical construction of a side arm of a head worn computer. In general, when a head worn computer takes the form of glasses, sun-glasses, certain goggles, or other such forms, two side arms are included for mounting and securing the had worn computer on the ear's of a person wearing the head worn computer. In embodiments, the side arms may also contain electronics, batteries, wires, antennas, computer processors, computer boards, etc. In embodiments, the side arm may include two or more sub assemblies. For example, as will be discussed in more detail below, the side arm may include a temple section and an ear horn section. The two sections may, for example, be mechanically arranged to allow an ear horn section to move such that both side arms can fold into a closed position.

FIG. 3A, FIG. 3B and FIG. 3C illustrate three separate views of a head worn computer 102 according to the principles of the present invention. Turning to the head worn computer illustrated as FIG. 3A, one side arm of the HWC 102 is folded into its closed position. The ear horn section 308 of the side arm is rotated relative to its temple section 304 to create space relative to the other side arm 310 so when the other side arm is moved into its closed position it can fully close. In a situation where the ear horn did not rotate to create the space (not illustrated) the ear horn would physically interfere with the other side arm 310, when the side arm was in the closed position, and prevent the other side arm 310 from fully closing. The HWC FIG. 3B view illustrates the HWC FIG. 3B with both side arms folded into a fully closed position. Note that the ear horn 308 is in the rotated position with respect to its temple section 304 such that the other arm 310 closed without interfering with the ear horn 308. The HWC FIG. 3C view also illustrates both arms in closed positions with the ear horn 308 rotated to create the space for the other arm 310 to fully close. FIG. 3C also illustrates a portion of the HWC 102 where electronics may be housed in a top mount 312. The top mount may contain electronics, sensors, optics, processors, memory, radios, antennas, etc.

Figure 4:
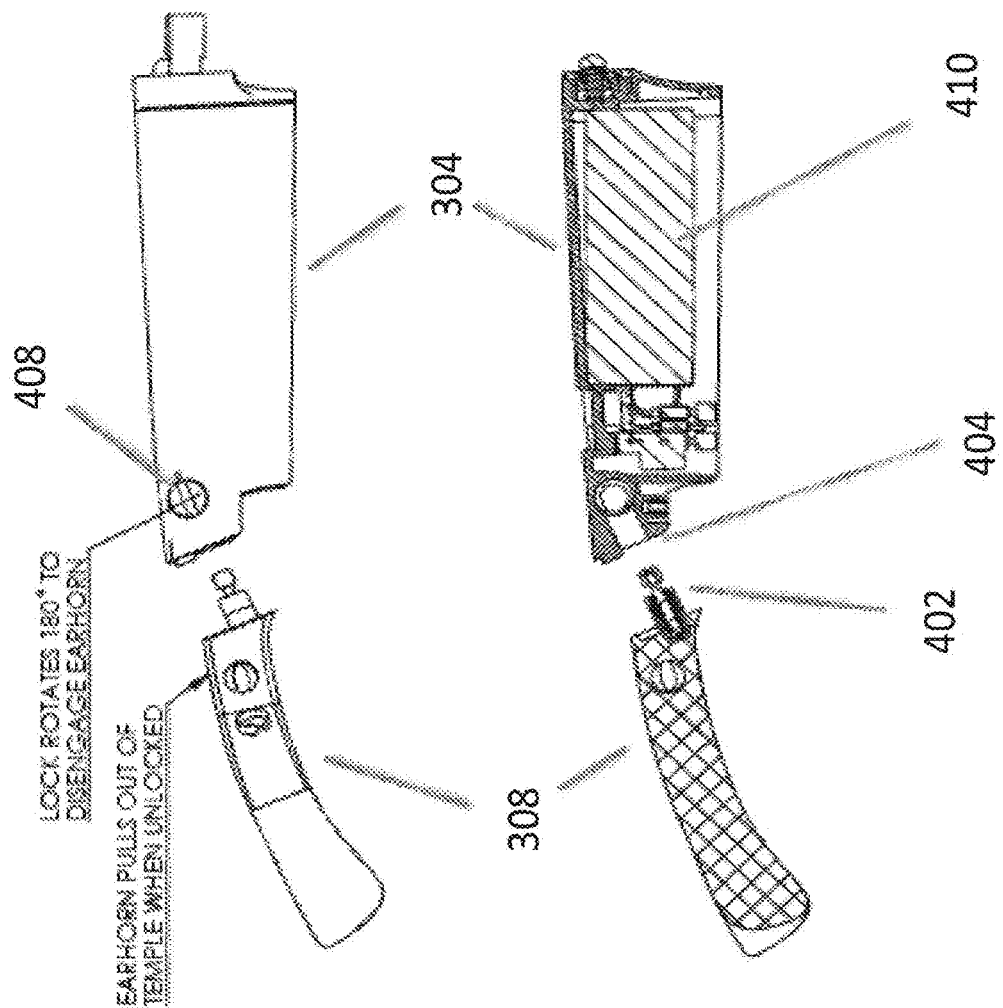
FIG. 4 illustrates a temple and ear horn in accordance with the principles of the present invention.

FIG. 4 illustrates a side arm configuration in accordance with the principles of the present invention. In this embodiment, the side arm includes two sub assemblies: the temple section 304 and the ear horn 308. FIG. 4 illustrates two views of the side arm assembly, one from an outer perspective and one from a sectioned perspective. The ear horn includes a pin 402 that is designed to fit into a hole 404 and to be secured by connector 408. The connector 408 is rotatable and in one position locks the pin 402 in place and in another position unsecures the pin 402 such that the ear horn 308 can be removed and re-attached to the temple section 304. This allows the detachment and re-attachment of the ear horn 308 from the temple section 304. This also allows for the sale of different ear horns 308 for replacement, of which a variety of colors and patterns may be offered. In embodiments, the temple section 304 may include a battery compartment 410 and other electronics, wires, sensors, processors, etc.

Figure 5:
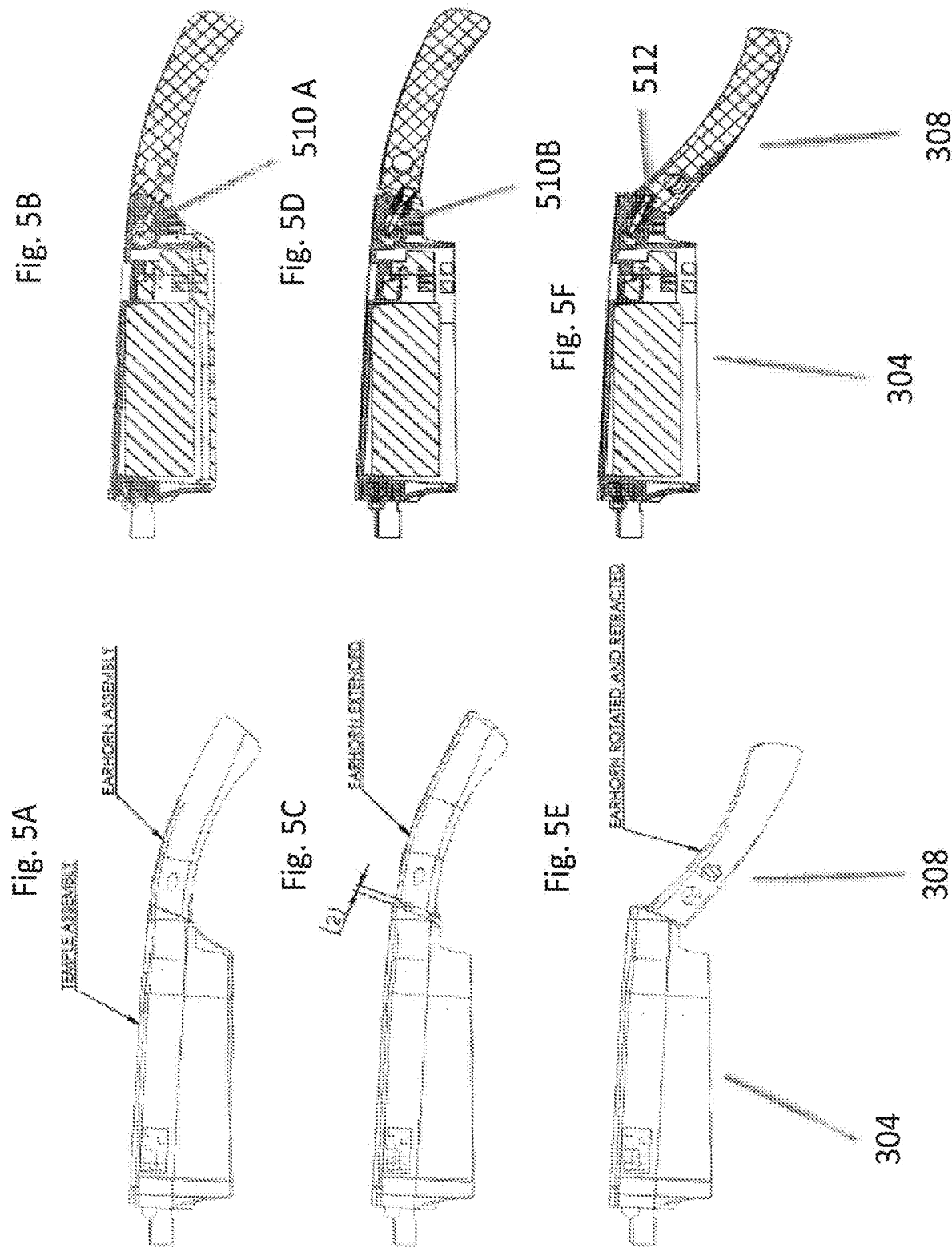
FIG. 5A, FIG. 5B, FIG. 5C, FIG. 5D, FIG. 5E.
FIG. 5F illustrate a temple and ear horn assembly in various states in accordance with the principles of the present invention.

FIG. 5A, FIG. 5B, FIG. 5C, FIG. 5D, FIG. 5E. and FIG. 5F illustrate several views of a HWC side arm with temple 304 and ear horn 308 sections. The views include outer perspectives and cross sections as well as various states of the security of the ear horn 308 with the temple section 304. One embodiment of an outer perspective and cross-section of a temple assembly and ear horn assembly is shown in FIG. 5A and FIG. 5B, respectively, including connector and pin assembly 510A, wherein the ear horn is in its final secured position and ready to be put on the head of a user FIG. 5C and FIG. 5D illustrate the ear horn 308 and the temple section 304 in a secure, but separated and un-rotated position. The same pin 402 and connector 408 system described in connection with FIG. 4 is illustrated in the cross sections of FIG. 5E and FIG. 5F at connector and pin assembly 512. In the secured un-rotated position the pin is pulled internally within the temple section firmly such that it stays in place. FIG. 5C and FIG. 5D illustrate a state where the ear horn 308 is separated from the temple section 304. This state is achieved when pressure is used to pull on the ear horn 308. In embodiments, the pressure is exerted by a user pulling on the ear horn 308, which compresses a spring in the connector and pin assembly 510B that is mechanically associated with the pin 402 in the ear horn 308. The mechanism uses the spring to maintain pressure on the pin 402 to maintain connection with the connector 408 when the connector 408 is in a position to lock the pin 402 in position. FIG. 5E and FIG. 5F illustrates a state where, after the ear horn 308 has been pulled into the state described in connection with FIG. 5C and FIG. 5D, the ear horn 308 is rotated about the pin 402. This puts the ear horn 308 in a rotated position as described herein such that the first arm, with this rotated ear horn 308, does not interfere with the closure of the other arm 310 when the two arms are folded into the closed position. FIG. 5E and FIG. 5F illustrates the connector and pin assembly as continuing to secure the ear horn 308 to the temple 304 in the rotated position.

Figure 6:
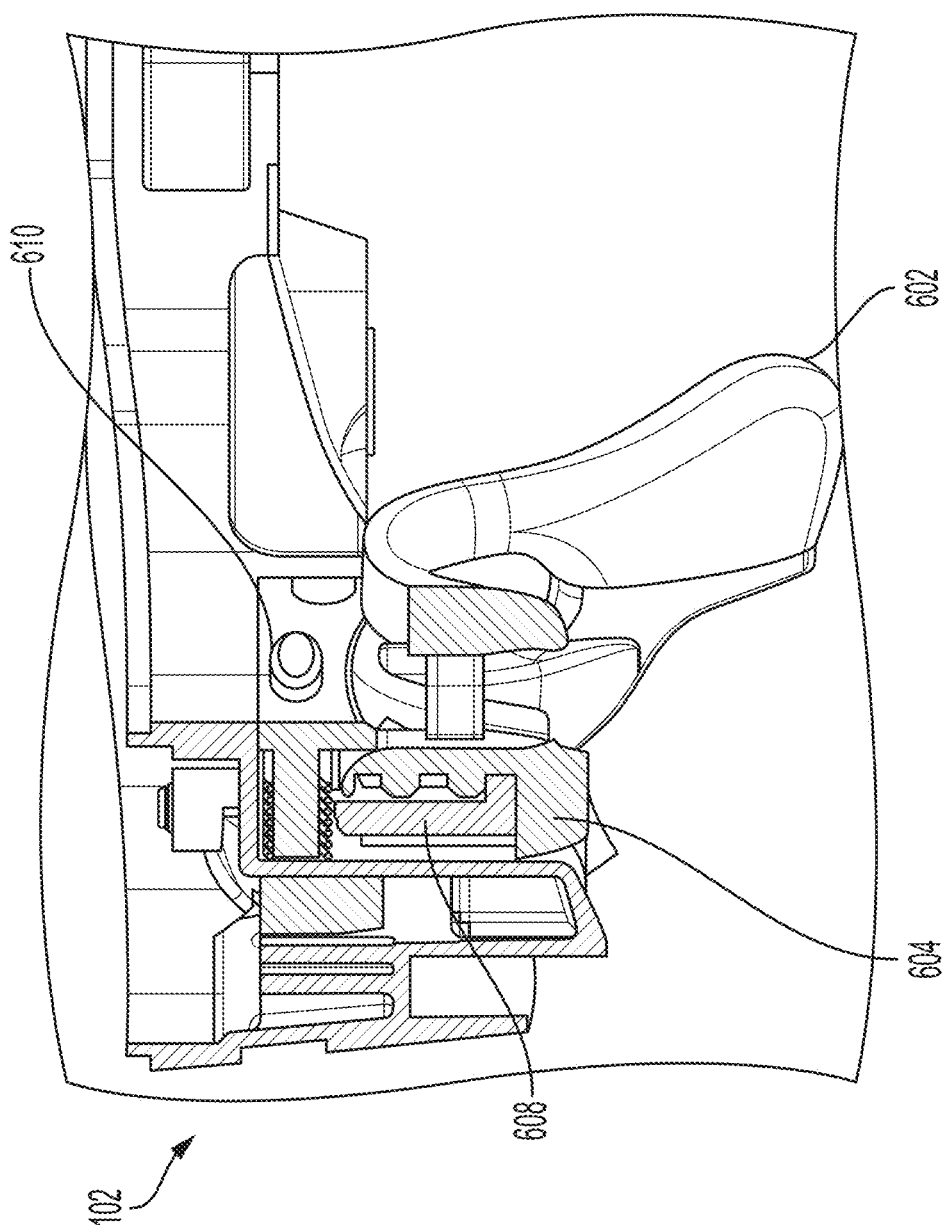
FIG. 6 illustrates an adjustable nose bridge assembly in accordance with the principles of the present invention.
Figure 7:
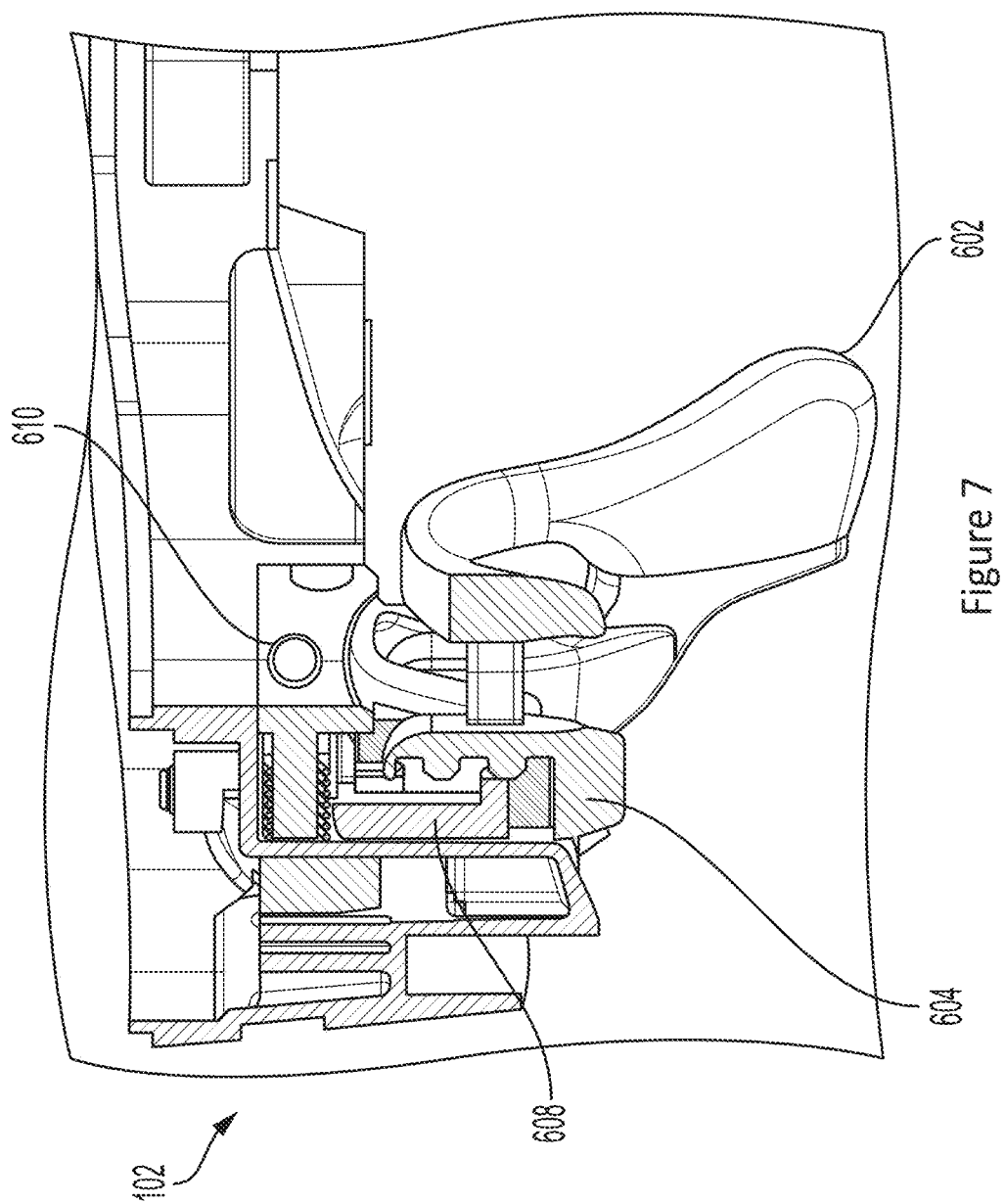
FIG. 7 illustrates an adjustable nose bridge assembly in accordance with the principles of the present invention.

An aspect of the present invention relates to an adjustable nose bridge. An adjustable nose bridge may be important with head worn computers, especially those with computer displays, to ensure comfort and alignment of the displays and/or other portions of the head worn computer. FIG. 6 illustrates a HWC 102 with an adjustable nose bridge 602. The nose bridge is adjustable through a mechanism in the HWC 102. In embodiments, the mechanism includes a fixed notched attachment 604, a movable pin 608 adapted to fit into the notches of the notched attachment 604, and a selection device 610 that is attached to the movable pin 608. The movable pin 608 and nose bridge 602 are connected such that the as the movable pin 608 shifts in position the nose bridge 602 moves in position as well. The selection device 610 causes the movable pin 608 to engage and disengage with the fixed notched attachment 604 when presses and allowed to retract. As illustrated in FIG. 6, the selection device 610 is not in a pressed position so the movable pin 608 is engaged with the notched attachment 604 such that the nose bridge is securely attached in a stable position. FIG. 7 illustrates a scenario where the selection device is pressed, or activated, such that the moveable pin 608 is no longer engaged with the fixed notched attachment 604. This allows the nose bridge 602 to move up and down with respect to the rest of the HWC 102. Once the movable pin 608 aligns with a notch of the notched attachment 604, the two parts may engage to re-secure the nose bridge in the HWC 102.

In embodiments, a side arm of the HWC 102 may include an audio jack (not shown) and the audio jack may be magnetically attachable to the side arm. For example, the temple section 304 or ear horn section 308 may have a magnetically attachable audio jack with audio signal wires associated with an audio system in the HWC 102. The magnetic attachment may include one or more magnets on one end (e.g. on the head phone end or the side arm end) and magnetically conductive material on the other end. In other embodiments, both ends of the attachment may have magnets, of opposite polarization, to create a stronger magnetic bond for the headphone). In embodiments, the audio signal wires or magnetic connection may include a sensor circuit to detect when the headphone is detached from the HWC 102. This may be useful in situations where the wearer is wearing the headphones during a period when there is not constant audio processing (e.g. listening for people to talk with periods of silence). In embodiments, the other side's headphone may play a tone, sound, signal, etc. in the event a headphone is detached. In embodiments, an indication of the detachment may be displayed in the computer display.

In embodiments, the HWC 102 may have a vibration system that vibrates to alert the wearer of certain sensed conditions. In embodiments, the vibration system (e.g. an actuator that moves quickly to cause vibration in the HWC 102) may be mounted in a side arm (e.g. the temple section 304, or ear horn 308), in the top mount 312, etc. In embodiments, the vibration system may be capable of causing different vibration modes that may be indicative of different conditions. For example, the vibration system may include a multi-mode vibration system, piezo electric vibration system, variable motor, etc., that can be regulated through computer input and a processor in the HWC 102 may send control signals to the vibration system to generate an appropriate vibration mode. In embodiments, the HWC 102 may be associated with other devices (e.g. through Bluetooth, WiFi, etc.) and the vibratory control signals may be associated with sensors associated with the other device. For example, the HWC 102 may be connected to a car through Bluetooth such that sensor(s) in the car can cause activation of a vibration mode for the vibration system. The car, for example, may determine that a risk of accident is present (e.g. risk of the driver falling asleep, car going out of its lane, a car in front of the wearer is stopped or slowing, radar in the car indicates a risk, etc.) and the car's system may then send a command, via the Bluetooth connection, to the HWC 102 to cause a vibratory tone to be initiated in the HWC 102.

Another aspect of the present invention relates to a removable and replaceable speaker assembly for a HWC 102. There are times when different speaker types are desired or when a speaker may malfunction. It is therefore desirable to have a speaker assembly that is removable and replaceable by the user. To facilitate the removal and reattachment of the speaker assembly a magnetic or magnetic attachment system may be included. For example, the speaker assembly and head-worn computer may include magnetic elements such that the speaker can be removed by exerting pressure and replaced by getting the two sections close to one another. In another example, the speaker or head-worn computer may have a button, slider, etc. that can be interacted with to remove the speaker. In embodiments, the speaker assembly may have a form factor of an ear bud, ear phone, head phone, head set, external ear speaker, etc. In embodiments, the speaker assembly may include a vibratory system to provide haptic feedback to the user. In embodiments, such a removable and replaceable speaker system may be provided to both of the user's ears.

Figure 8:
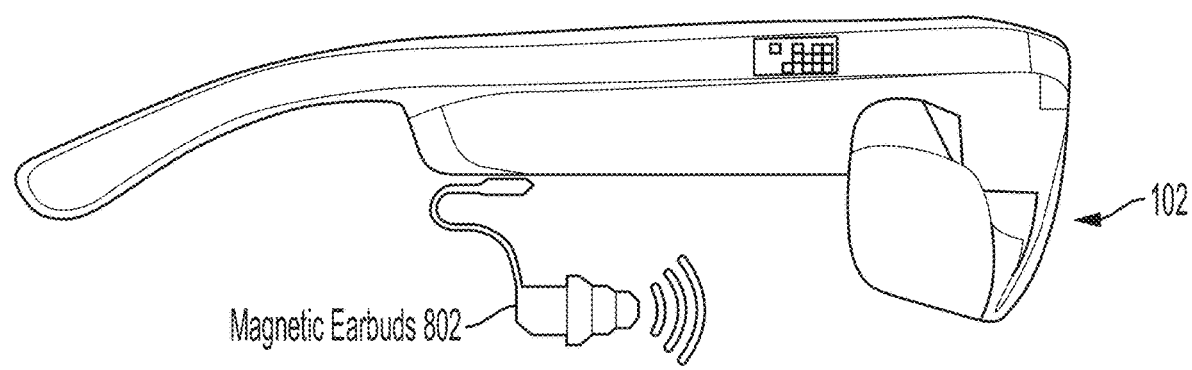
FIG. 8 illustrates speaker assemblies for head-worn computers in accordance with the principles of the present invention.

FIG. 8 illustrates several embodiments where HWC 102's are associated with speaker systems. Earbud 802 may be removably attached to the HWC 102 with a magnetic system or mechanical system or combination thereof. In some embodiments, a speaker may also be removably attached to the HWC 102 in a similar way. The speaker may be positioned to emit sound towards the user's ear but not actually be positioned in the ear. This configuration may provide for greater environmental hearing for the user as the ear would not be blocked by an ear bud, head phone, etc. The speaker may generate audio waves and/or ultrasonic waves that are converted into audio when they are emitted through the air. When ultrasonic transducers are used, more than one frequency transducer may be included. See http://en.m.wikipedia.org/wild/Sound from ultrasound and http://www.holosonics.com for references on generating sound from ultrasound. The speaker and/or a piezo vibratory system can be integrated into the temple. In embodiments, this module may be integrated such that it can be removed and replaced and it may also be adapted such that it does not hang below the temple piece. Each of the removable and replaceable speaker systems described herein may include a vibratory system (e.g. piezo electric circuit that is controlled by the HWC 102).

In embodiments, a head-worn computer may include a temple portion mechanically secured to a computer display and adapted to position the computer display in front of an eye of a user, and the temple portion including a speaker attachment, wherein the speaker attachment is adapted to securely position a speaker assembly and electrically associate the speaker assembly with electronics internal to the head-worn computer and facilitate the user's release and re-securing of the speaker assembly with the temple portion. The speaker attachment may include a magnetic element, moveable mechanical element, etc. or combination thereof to secure and unsecure the speaker system from the HWC 102. The speaker assembly may have a form factor adapted to be inserted into an outer ear of the user, cover at least a portion of an outer ear of the user, cover substantially all of an outer ear of the user, to position the speaker under the temple assembly and above an ear of the user, to position a speaker under the temple assembly and in front of an ear of the user, angle the speaker towards the ear, etc. The speaker system may further have a vibratory system to provide haptic feedback to the user. The haptic feedback may be coordinated with a game being presented in the computer display, an application running on the HWC 102, etc. In embodiments, a vibratory system is provided in both speaker systems to provide controllable haptic feedback in stereo and/or on both or either side of the user's head.

In embodiments, the connection between the speaker system and the HWC 102 may be positioned other than under the temple section. It may be positioned on a side, top, bottom, end of a section of the side arm, for example. It may be positioned on the front bridge, for example. In embodiments, the speaker system may be connected to a top or side portion and the speaker may be further positioned to face forward, away from the user's ear. This may be a useful configuration for providing sound to others. For example, such a configuration may be used when the user wants to provide translations to a person nearby. The user may speak in a language, have the language translated, and then spoken through the forward facing speakers.

The removable nature of the speaker systems may be desirable for breakaway situations so a snag does not tear the glasses from the user or pull hard on the user's ear. The removable nature may also be useful for modularity configurations where the user wants to interchange speaker types or attach other accessories. For example, the user may want ear buds at one point and an open ear speaker configuration at another point and the user may be able to make the swap with ease given this configuration. The port on the HWC 102 may also be adapted for other accessories that include lights or sensors for example. The accessory may have an ambient light sensor to assist with the control of the lighting and contrast systems used in the HWC 102 displays, for example. In embodiments, the speaker port may be used as a charging port for the HWC 102 or data port for the HWC 102.

Another aspect of the present invention relates to securing the head-worn computer 102 to the user's head in a way that the computer does not slip down the nose of the user, due to the extra front weight of the HWC 102, but does not create discomfort for the user. While some have designed systems that use lateral force between the two side arms to squeeze the HWC arms on the sides of the user's head, this solution tends to cause comfort problems. The squeeze on the user's head has to be relatively high, as compared to non-computer glasses, to maintain enough pressure to overcome the additional weight in the front of the glasses and this high pressure tends to cause comfort issues. In embodiments of the present invention, a substantially stiff ear horn is provided and the back end of the ear horn wraps around the user's head and touches the user's head. The touch point is towards the back of the user's head such that it provides a point or area of counteracting force for the HWC 102 if it tries to pull forward or down the user's nose due to the front weight of the HWC 102. In embodiments, the end of the ear horn, or a section near the end, has a touch pad. The touch pad may be made of soft material so it is comfortable on the back of the user's head. In embodiments, the touch pad may be mounted such that it has angular flexibility. The angular flexibility allows the touch pad to better align with the touch point on the user's head so it can provide the counteractive force but spread the force over an area for greater comfort.

In embodiments, a head-worn computer is provided and has a see-through computer display configured to be mounted on the head of a user; a side arm configured to secure the see-through computer display to the user's head, the side arm further configured to be positioned to lay against the user's head proximate an ear of the user; and the side arm including a stiff member extending behind the ear of the user, contoured to substantially follow a curvature of the user's head behind the ear of the user, and to touch a portion of the user's head towards the rear of the user's head such that the see-through computer display remains substantially secure in a position in front of an eye of the user.

In embodiments, the stiff member is removeably secured to a temple portion of the side arm (as described herein elsewhere). The stiff member may be telescopically adjustable to fit the user's head. The stiff member may be provided with a ratchet style securing mechanism for adjusting the telescopic adjustment. The stiff member may be provided with a rotatable style securing mechanism for adjusting the telescopic adjustment, or another style securing mechanism may be provided. The stiff member may touch a portion of the user's head at a rear end of the stiff member. The rear end of the stiff member may include a touch pad. The touch pad may be made of a soft material to increase the comfort and surface area of the touch area. The touch pad may be attached such that it has angular flexibility such that the touch pad changes position to increase a touch surface in contact with the rear of the user's head.

FIG. 9 illustrates a HWC 102 mounted on the head of a user. The HWC 102 has a see-through optics module 204, a temple portion 304, a stiff ear horn 904 and a head-touch pad 902. As described herein elsewhere, the stiff ear horn 904 may be removable and replaceable. This can be useful when the exchange of ear horns from one type to another or one size to another is desired, for example. The stiff ear horn 904 may be made of aluminum, aluminum tubing, carbon fiber, or other material that is relatively stiff. The stiffness should be of a level that provides for lateral inflexibility such that the touch pad 902 can exert counteracting force with a high rear facing vector. Too much flexibility in the stiff ear horn 904 can detract from the rear-facing vector of force when the weight of the HWC 102 is pulling forward/down the nose. In embodiments, several different lengths, shapes, stiffnesses, etc. of stiff ear horn 904 may be provided so the user can select the set that best serves his purpose. The head-touch pad 902 may be made of a soft material, malleable material, etc. to provide comfort to the user and to increase the head touch surface. The head-touch pad 902 may also be mounted in such a way that the head-touch pad 902 can flex and/or change angle as it is pressed upon. The head-touch pad 902 may, for example, be mounted on the stiff ear horn 904 with a hinge or pivot mechanism such that the head-touch pad 902 self aligns with the user's head when the HWC 102 is put on the user's head. This configuration may increase the touch surface area between the head-touch pad 902 and the user's head and generate a larger counteracting force to prevent the slipping or moving of the HWC 102.

In embodiments, the side arms of the HWC 102 are designed to exert inward lateral pressure on the user's head, but the lateral pressure is reduced so it is not uncomfortable, along with having stiff side arms 904 and head-touch pads 902. In these embodiments, the ear horns 904 and head touch pads 902 cause significant counteracting forces in addition to the counteracting forces applied through the inward lateral forces applied by the side arms.

Another aspect of the present invention relates to the thermal management of the head-worn computer. In embodiments, the head-worn computer is a high functioning self-contained computer with wireless connectivity where the electronics are compacted to fit into a glasses style form factor. In embodiments, the main heat producing electronics are in an upper portion of a bridge section over the top of the lenses of the head-worn computer (e.g. as described in connection with FIG. 3B). The thermal management technologies described herein manage the heat such that the system can operate in high temperature environments (e.g. 55 degrees C. ambient) and maintain a comfortable temperature for the user (e.g. below 70 degrees C. along the forehead section).

FIG. 3B illustrates an embodiment of a head-worn computer wherein the electronics are housed in an upper bridge section above the lenses of the glasses form factor. This has been referred to as the top mount 312. The top mount 312 may include the majority of the electronics that are used to form the fully functional computer. This may include the processor, memory, sensors, cameras, optical drive system, etc. In this embodiment, the batteries are housed in the temple portions of the side arms. The top mount 312 may include a cavity where the circuit board(s) are housed and secured. The top mount may also include a top plate 1000 designed to be mounted on the top of the cavity such that it forms a portion of the enclosure. In embodiments, the top plate 1000 is designed to receive heat from the circuit board and/or components mounted on the circuit board and then dissipate the heat into the environment surrounding the head-worn computer.

Figure 10:
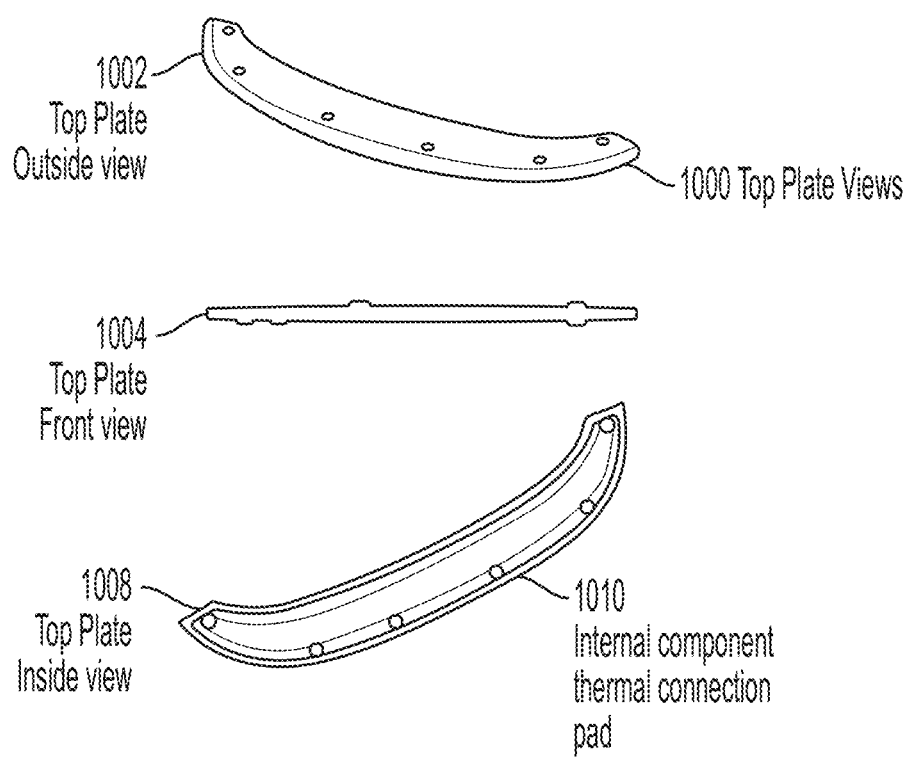
FIG. 10 illustrates a top plate in accordance with the principles of the present invention.

FIG. 10 illustrates several perspective views of an embodiment top plate 1000. The top plate outside view 1002 illustrates the heat dissipating fins on the top of the top plate 1002. The heat dissipating fins are on the outside of the completed head-worn computer assembly and dissipate the heat into the surrounding environment. The top plate front view 1004 illustrates a front perspective of the top plate. The top plate inside view 1008 illustrates a bottom view of the top plate. The bottom is the portion that is on the inside of the circuit board cavity in the fully assembled head-worn computer. The bottom of the top plate 1000 may have features to facilitate the mechanical and thermal connection with the circuit board and/or components on the circuit board. For example, in the embodiment illustrated in FIG. 10 the top plate 1000 includes an internal component thermal connection pad 1010. The thermal connection pad 1010 may be adapted to mechanically and thermally connect with the internal circuit board and/or a component on the circuit board (e.g. the processor, memory, or other heat producing component). The assembly may have intervening material between the top plate 1000 and the circuit board and/or circuit board component (e.g. a heat spreader plate designed to receive heat from a component or set of components and then spread the heat over an area, thermally conductive paste, glue, pad, or other facilitating material). In embodiments, a thermally conductive material is placed between the circuit board and/or circuit board component(s) and the thermal connection pad 1010 of the top plate 1000 to eliminate any air gap that might otherwise develop as a result of the mechanical mismatch of the components in the assembly. This can further facilitate the transfer of heat from the heat producing component(s) (e.g. the processor) to the thermal connection pad 1010 and out to the surrounding environment through the heat dissipating fins. The inventors used a thermally conductive material from Fujupoly in the thermally tested devices. This material has an advertised thermal conductivity of 11 Watt/m-k. Watt/m-k is a unit of measurement of thermal efficiency for thermal interface material.

Figure 11:
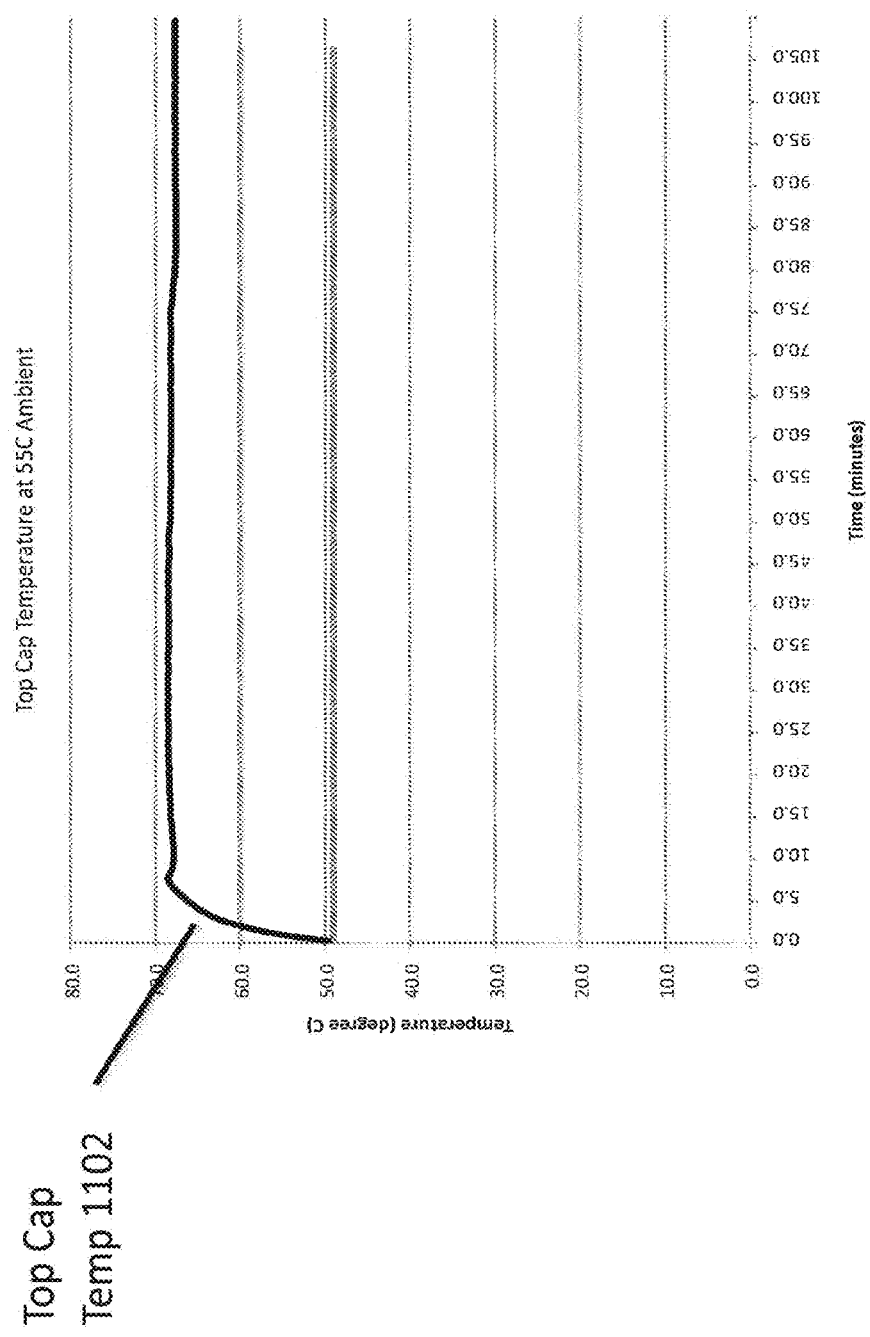
FIG. 11 illustrates temperature test results of an embodiment of the present invention.

FIG. 11 illustrates some test results relating to a head-worn computer with a top plate 1000 assembly as described herein. The head-worn computer was placed in an environmental chamber at 55 degrees Celsius. The head-worn computer was then turned on and the top plate 1000 temperature was observed. Operation of the processor was also observed. As can be seen, the maximum temperature of the top plate 1000 remained below 70 degrees Celsius. While 70 degrees Celsius is still a fairly hot maximum temperature, the heat dissipating fins caused the assembly to be comfortable to the human touch. In addition to maintaining an acceptable outside assembly temperature, the processor continued to operate throughout the testing, which is a significant advantage over the state of the art.

Although embodiments of HWC have been described in language specific to features, systems, computer processes and/or methods, the appended claims are not necessarily limited to the specific features, systems, computer processes and/or methods described. Rather, the specific features, systems, computer processes and/or and methods are disclosed as non-limited example implementations of HWC. All documents referenced herein are hereby incorporated by reference.

We claim:

1. A device comprising:
    a frame coupled to a first arm and further coupled to a second arm, the frame configured to rest on a user's head via the first arm and the second arm;
    a first compartment coupled to an upper portion of the frame and comprising an outer member;
    an electronic system disposed within the first compartment, the electronic system configured to produce heat;
    display coupled to a lower portion of the frame, the display configured to concurrently display digital imagery and a view of a surrounding environment; and
    a thermal conductor adapted to facilitate a thermal connection between the electronic system and the outer member, wherein the electronic system is configured to be cooled by transference of the produced heat through the thermal conductor and the outer member;
    wherein the first arm and a second arm are adapted to secure the first compartment on the user's head, at least one of the first arm and the second arm comprising an electrical connection for supplying power to the electronic system.

2. The device of claim 1, wherein the first compartment further comprises a wireless communication system.

3. The device of claim 1, wherein one or more of the first arm and the second arm comprises a respective removable ear horn.

4. The device of claim 1, wherein one or more of the first arm and the second arm comprises:
    a respective battery compartment for receiving a battery; and
    a respective battery connection for connecting to the battery to supply power to the electronic system.

5. The device of claim 4, wherein the respective battery compartment of the first arm is in a temple section of the first arm, wherein the temple section is disposed along the first arm.

6. The device of claim 1, wherein the electronic system comprises a processor.

7. The device of claim 1, wherein the electronic system comprises one or more sensors.

8. The device of claim 1, wherein the electronic system comprises an optical drive system.

9. The device of claim 1, wherein the thermal conductor comprises one or more heat dissipating fins coupled to the outer member.

10. The device of claim 1, wherein a surface of the thermal conductor comprises a surface of the first compartment.

11. The device of claim 1, wherein the thermal conductor is configured to maintain a device operating temperature below 70 degrees Celsius.

12. A method comprising:
    cooling an electronic system of a device, wherein:
        the electronic system is configured to produce heat and is disposed within a first compartment of the device;
        the first compartment is coupled to an upper portion of a frame of the device and comprises an outer member;
        the frame is coupled to a first arm and further coupled to a second arm;
        the frame is configured to rest on a user's head via the first arm and the second arm;
        the device comprises a display coupled to a lower portion of the frame, the display configured to concurrently display digital imagery and a view of a surrounding environment;

the device further comprises a thermal conductor adapted to facilitate a thermal connection between the electronic system and the outer member; and cooling the electronic system comprises cooling by transference of the produced heat through the thermal conductor and the outer member.

13. The method of claim 12, wherein the first compartment further comprises a wireless communication system.

14. The method of claim 12, wherein one or more of the first arm and the second arm comprises a respective removable ear horn.

15. The method of claim 12, wherein one or more of the first arm and the second arm comprises:
a respective battery compartment for receiving a battery; and
a respective battery connection for connecting to the battery to supply power to the electronic system.

16. The method of claim 15, wherein the respective battery compartment of the first arm is in a temple section of the first arm, wherein the temple section is disposed along the first arm.

17. The method of claim 12, wherein the electronic system comprises a processor.

18. The method of claim 12, wherein the thermal conductor comprises one or more heat dissipating fins coupled to the outer member.

19. The method of claim 12, wherein a surface of the thermal conductor comprises a surface of the first compartment.

20. The method of claim 12, wherein cooling the electronic system comprises maintaining a device operating temperature below 70 degrees Celsius.

* * * * *